(12) United States Patent
Matick et al.

(10) Patent No.: US 7,460,423 B2
(45) Date of Patent: Dec. 2, 2008

(54) HIERARCHICAL 2T-DRAM WITH SELF-TIMED SENSING

(75) Inventors: Richard E. Matick, Cortlandt Manor, NY (US); Stanley E. Schuster, Granite Springs, NY (US)

(73) Assignee: International Business Machines Corporation, Armonk, NY (US)

(*) Notice: Subject to any disclaimer, the term of this patent is extended or adjusted under 35 U.S.C. 154(b) by 54 days.

(21) Appl. No.: 11/620,282

(22) Filed: Jan. 5, 2007

(65) Prior Publication Data
US 2008/0165560 A1 Jul. 10, 2008

(51) Int. Cl.
G11C 7/00 (2006.01)
G11C 5/06 (2006.01)
G11C 11/00 (2006.01)

(52) U.S. Cl. .................. 365/202; 365/63; 365/156; 365/193

(58) Field of Classification Search .............. 365/63, 365/149, 156, 202, 159, 193
See application file for complete search history.

(56) References Cited

U.S. PATENT DOCUMENTS

| | | | |
|---|---|---|---|
| 4,633,443 A | 12/1986 | Childers | |
| 5,675,529 A | 10/1997 | Poole | |
| 5,917,744 A | 6/1999 | Kirihata et al. | |
| 5,917,745 A | 6/1999 | Fujii | |
| 5,973,983 A | 10/1999 | Hidaka | |
| 6,115,307 A * | 9/2000 | Casper ............ | 365/202 |
| 6,130,845 A | 10/2000 | Ootsuki et al. | |
| 6,278,630 B1 | 8/2001 | Yamada | |
| 6,288,969 B1 | 9/2001 | Gibbins et al. | |
| RE37,409 E | 10/2001 | Barth et al. | |
| 6,333,866 B1 | 12/2001 | Ogata | |
| 6,426,905 B1 | 7/2002 | Dennard et al. | |
| 6,442,060 B1 | 8/2002 | Leung et al. | |
| 6,448,818 B1 | 9/2002 | Fletcher | |
| 6,449,201 B1 | 9/2002 | Kojima | |
| 6,456,521 B1 | 9/2002 | Hsu et al. | |
| 6,542,424 B2 | 4/2003 | Endo et al. | |
| 6,650,572 B2 | 11/2003 | Issa | |
| 6,657,886 B1 | 12/2003 | Adams et al. | |
| 6,898,663 B2 | 5/2005 | Winograd et al. | |
| 6,901,017 B2 | 5/2005 | Shimizu | |
| 6,998,663 B2 | 2/2006 | Yoshitomi et al. | |
| 7,057,230 B2 | 6/2006 | Tanaka et al. | |
| 7,082,076 B2 | 7/2006 | Terzioglu et al. | |
| 7,088,638 B1 | 8/2006 | Bunce et al. | |

(Continued)

FOREIGN PATENT DOCUMENTS

EP    1498903 A2    1/2005

(Continued)

*Primary Examiner*—Ly D Pham
(74) *Attorney, Agent, or Firm*—Cantor Colburn LLP; Mark Wardas

(57) ABSTRACT

An embodiment of the present invention is an array of 2 transistor DRAM cells organized in rows and columns in which the rows represent words and columns represent bits of the words, each bit column having a pair of balanced, true and complement bit lines, the bit lines being connected in a hierarchical bit line structure, comprising at least one local bit line pair and one global bit line pair, a sensing circuit connected to the global bit line pair detects a differential voltage transition on either line during a read access and provides a sensing strobe signal.

4 Claims, 4 Drawing Sheets

U.S. PATENT DOCUMENTS

| | | |
|---|---|---|
| 2005/0018510 A1 | 1/2005 | Terzioglu et al. |
| 2005/0125591 A1 | 6/2005 | Fujimoto |
| 2005/0141258 A1 | 6/2005 | Kang et al. |
| 2006/0023553 A1 | 2/2006 | Takeyama et al. |
| 2006/0067144 A1 | 3/2006 | Lui |
| 2008/0031029 A1* | 2/2008 | Liaw .......................... 365/63 |

FOREIGN PATENT DOCUMENTS

| | | |
|---|---|---|
| JP | 2004153700 | 5/2004 |

* cited by examiner

Self Timed WWL Circuit

HIERARCHICAL 2T-DRAM WITH SELF-TIMED SENSING

CROSS-REFERENCE TO RELATED APPLICATIONS

This application contains subject matter, which is related to the subject matter of the following co-pending applications, each of which is assigned to the same assignee as this application, International Business Machines Corporation of Armonk, N.Y. Each of the below listed applications is hereby incorporated herein by reference in its entirety:

entitled 'Hierarchical Six-Transistor SRAM', Ser. No. 11/620,297;

entitled 'Fast, Stable SRAM Cell Using Seven Devices and Hierarchical Bit/Sense Line', Ser. No. 11/620,316;

entitled 'eDRAM Hierarchical Differential Sense AMP', Ser. No. 11/620,328; and entitled 'DRAM Hierarchical Data Path', Ser. No. 11/108,369.

TRADEMARKS

IBM® is a registered trademark of International Business Machines Corporation, Armonk, N.Y., U.S.A. Other names used herein may be registered trademarks, trademarks or product names of International Business Machines Corporation or other companies.

BACKGROUND OF THE INVENTION

1. Field of the Invention

This invention relates to an array of 2 transistor DRAM cells organized in rows and columns, and in particular to an array in which the rows represent words and columns represent bits of the words, each bit column having a pair of balanced, true and complement bit lines, the bit lines being connected in a hierarchical bit line structure, comprising at least one local bit line pair and one global bit line pair, a sensing circuit connected to the global bit line pair detects a differential voltage transition on either line during a read access and provides a sensing strobe signal.

2. Description of Background

Random access memories (RAMs) are well known in the art. A typical RAM has a memory array wherein every location is addressable and freely accessible by providing the correct corresponding address. Dynamic RAMs (DRAMs) are dense RAMs with a very small memory cell. High performance Static RAMs (SRAMs) are somewhat less dense (and generally more expensive per bit) than DRAMs, but expend more power in each access to achieve speed, i.e., provide better access times than DRAMs at the cost of higher power and area. In a typical data processing system, the bulk of the memory is DRAM in main memory with faster SRAM in cache memory, closer to the processor or microprocessor. Caching is an effective technique for increasing microprocessor performance. RAMs are commonly made in the well-known complementary insulated gate field effect transistor (FET) technology known as CMOS.

A typical CMOS logic circuit, for example, includes paired complementary devices, i.e., an n-type FET (NFET) paired with a corresponding p-type FET (PFET), usually gated by the same signal. Since the pair of devices have operating characteristics that are, essentially, opposite each other, when one device (e.g., the NFET) is 'ON' and conducting (ideally modeled as a resistor (R) in series with the closed switch), the other device (the PFET) is 'OFF', not conducting (ideally modeled as an open switch) and, vice versa. For example, a CMOS inverter is a series connected PFET and NFET pair that is connected between a power supply voltage (Vdd) and ground (GND). A typical static random access memory (SRAM) cell, ideally includes a balanced pair of cross-coupled inverters storing a single data bit with a high at the output of one inverter and a low at the output of the other. A pair of pass gates (also ideally, a balanced pair of FETs) selectively connects the complementary outputs of the cross-coupled inverter to a corresponding complementary pair of bit lines. A word line connected to the gates of the pass gate FETs selects connecting the cell to the corresponding complementary pair of bit lines. During a cell access, the pass gates are turned 'ON' to couple the bit line contents to the cross-coupled inverters. In a well designed SRAM, once data is stored in a cell and unless power is lost, the cell maintains that data until it is overwritten.

A DRAM cell is essentially a capacitor for storing charge and a switch, a pass transistor (also called a pass gate or access transistor) that switches 'ON' and 'OFF' to transfer charge to and from the capacitor. Thus, a typical DRAM cell is much smaller (denser) than a typical SRAM cell, e.g., <¼. Data (1 bit) stored in the cell is determined by the absence or presence of charge on the storage capacitor. Since each cell has numerous leakage paths from the storage capacitor, unless it is periodically refreshed, charge stored on the storage capacitor eventually leaks off. Each DRAM cell is read by coupling the cell's storage capacitor (through the access transistor) to a bit line, which is a larger capacitance, and measuring the resulting voltage difference on the bit line. Since each time a cell is read, the voltage on the storage capacitor is equalized with the voltage on the bit line, the cell's contents are destroyed by the read, i.e., a destructive read.

As is further well known in the art, the maximum voltage that an FET pass gate will pass is its gate to source voltage ($V_{gs}$) reduced by the FET turn-on or threshold voltage ($V_T$), i.e., the stored voltage ($V_{St}$) on the storage capacitor ($C_{cell}$) is $V_{St}=V_{gs}-V_T$. The magnitude of the signal ($V_{sig}$) transferred to the bit line with capacitance $C_{BL}$ is $V_{sig}=C_{cell}V_{St}/(C_{cell}+C_{BL})$. In a typical state of the art DRAM (e.g., 256 Mbit or 1 Gbit) with up to 512 or even 1024 bits on each bit line, $C_{BL}$ is at least one order of magnitude larger than $C_{cell}$. So, $V_{sig}$ is typically at least an order of magnitude smaller than the supply voltage, $V_{dd}$, and is, typically, a few hundred millivolts (mv). Further, that signal develops exponentially with a time constant dependent upon the overall RC time constant of the signal path, i.e., where 'R' includes the FET on resistance and $C=C_{cell}+C_{BL}$. Thus, developing a sufficient bit line signal to sense, i.e. to transfer a portion of $V_{St}$ to the bit line, typically accounts for most of the read time of a state of the art DRAM.

Unfortunately, DRAM read time has been much longer than SRAM read time, e.g., an order of magnitude. Consequently, this longer read time has been a significant deterrent to using DRAM in high performance logic chips and the primary reason less dense but faster SRAM is used for cache memory.

Thus, there is a need for high performance DRAMs, especially with reduced cell read times and more particularly, for high performance DRAMs suitable for embedded use in logic chips.

SUMMARY OF THE INVENTION

The shortcomings of the prior art are overcome and additional advantages are provided through the provision of a DRAM memory array comprising a plurality of memory cells, each of the plurality of memory cells further comprising a device, each of the plurality of memory cells having two of the device organized in a row representing a plurality of words and a bit column representing bits of the plurality of words, each bit column having a true bit line, and a complement bit line, the true bit line and the complement bit line being balanced and connected in a hierarchical bit line structure, the hierarchical bit line structure comprising a local bit line true, a local bit line complement, a global bit line true, a global bit line complement, and a sensing circuit, the sensing circuit is connected to the global bit line true and the global bit line complement effectuating detecting of a differential voltage transition on either line during a read access and providing a sensing strobe signal.

System and computer program products corresponding to the above-summarized methods are also described and claimed herein.

Additional features and advantages are realized through the techniques of the present invention. Other embodiments and aspects of the invention are described in detail herein and are considered a part of the claimed invention. For a better understanding of the invention with advantages and features, refer to the description and to the drawings.

TECHNICAL EFFECTS

As a result of the summarized invention, technically we have achieved a solution, which is a completely symmetrical and balanced hierarchical 2T DRAM design ideally suited for a moderately high-performance memory application. In addition, the design greatly simplifies the timing for restoring the data immediately after a read cycle.

BRIEF DESCRIPTION OF THE DRAWINGS

The subject matter, which is regarded as the invention, is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

Figure 1:
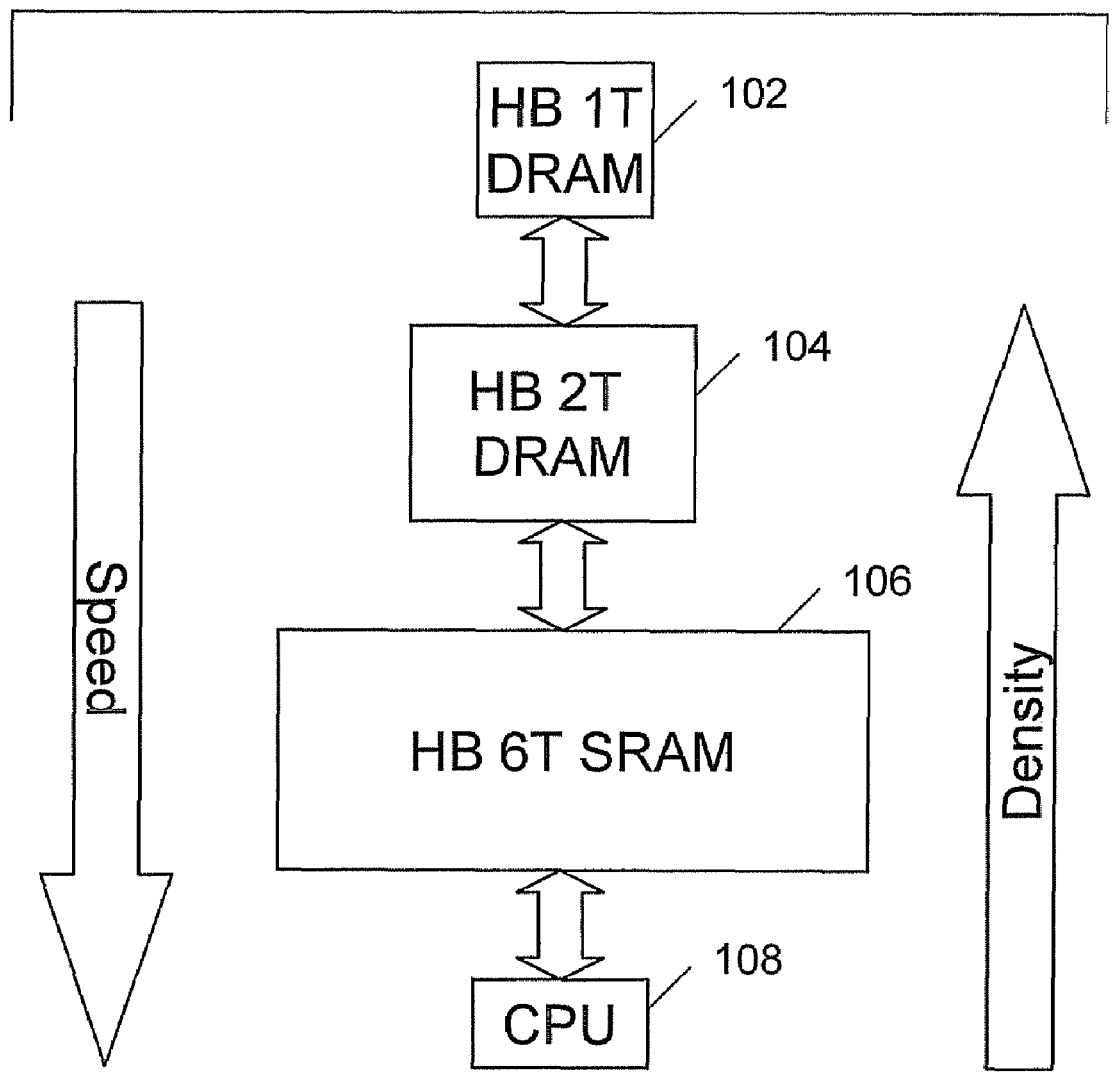
FIG. 1 illustrates one example of a hierarchical block diagram.

Turning now to the drawings in greater detail, it will be seen that in a memory hierarch, speed, density, and cell stability are extremely important. The relative importance of each of these factors changes with the level of the hierarchy one example of which is illustrated in the block diagram of FIG. 1. In an exemplary embodiment, the areas of the rectangles represent the memory cells typically used at the different levels of the memory hierarchy. The hierarchical bit-line-2T cell 104 also referred to as HB 2T DRAM 104 in FIG. 1 illustrates where in an exemplary embodiment it might fit in a complete memory hierarchy. As illustrated, speed is the most critical factor for the level closest to the processor 108 where HB 6T SRAM 106 is located, while cell area (density) is more important as you move further from the processor 108 where HB 2T DRAM 104, and HB 1T DRAM 102 are located.

The hierarchical 2T DRAM is a completely symmetrical and balanced design and is ideally suited for a moderately high-performance memory application. In addition, it greatly simplifies the timing for restoring the data immediately after a read cycle.

Figure 2:
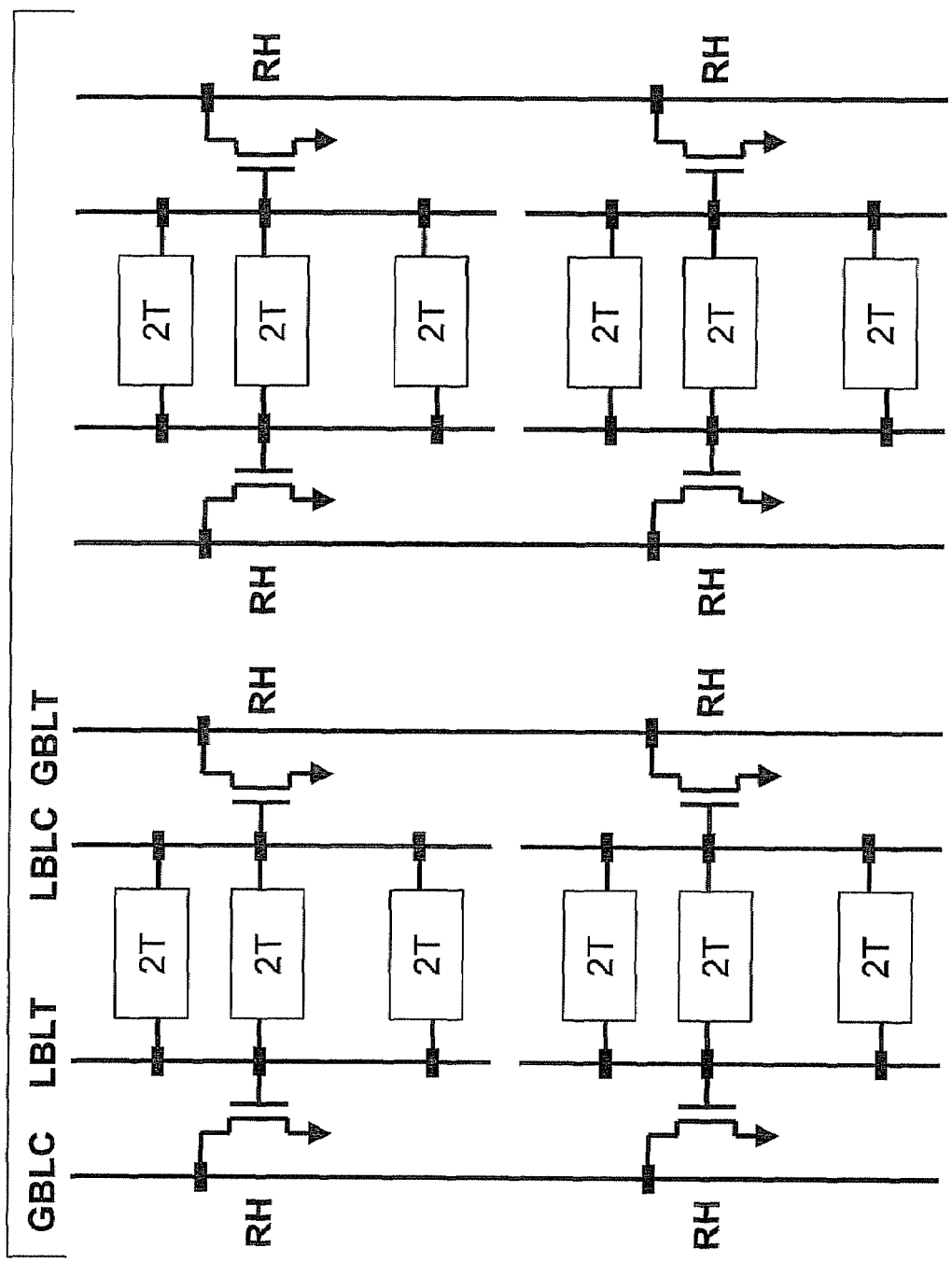
FIG. 2 illustrates one example of a simplified diagram of the hierarchical bit line architecture.
Figure 3:
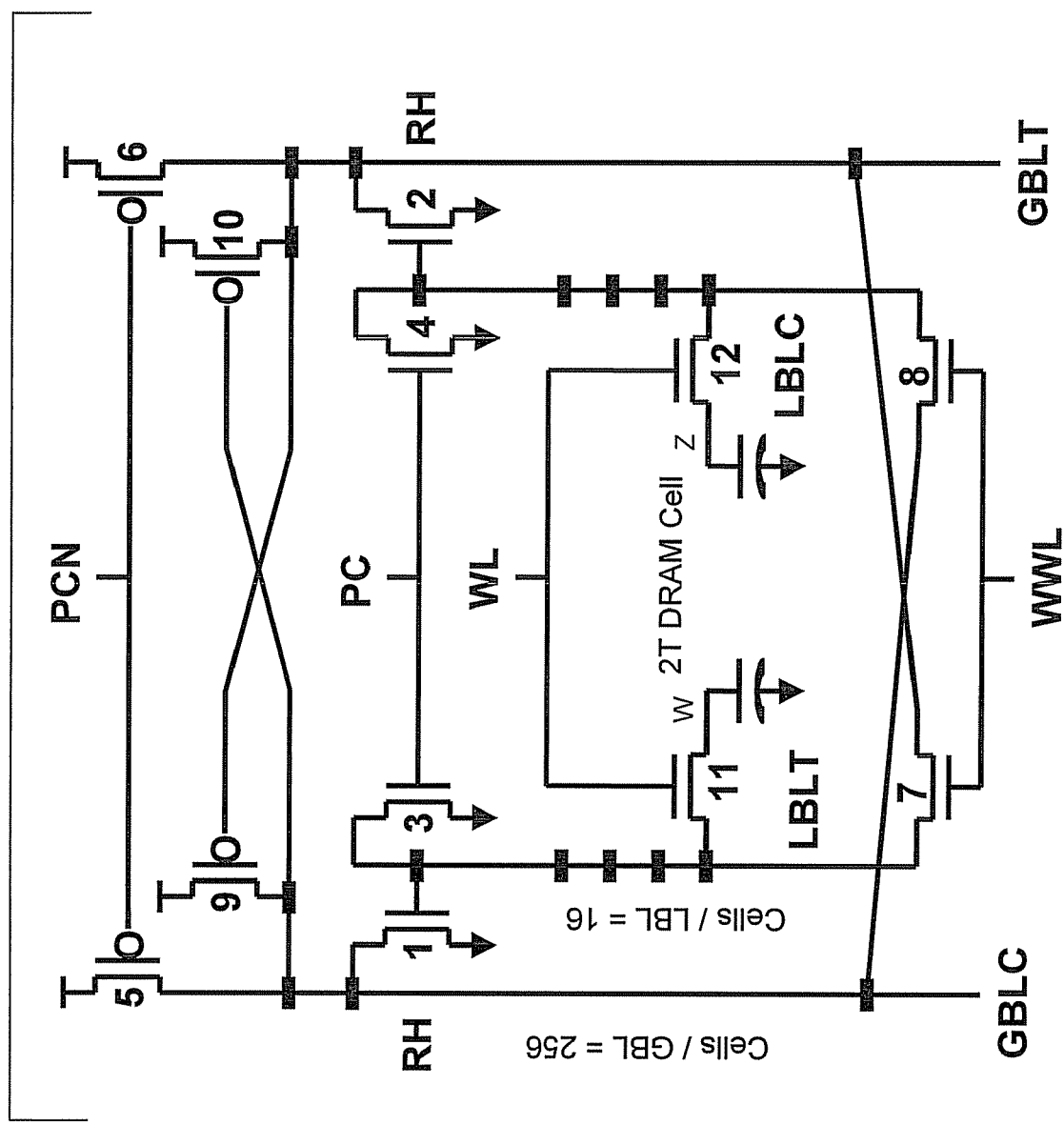
FIG. 3 illustrates one example of a detailed diagram of a 2T DRAM cell.

One example of a simplified diagram of the hierarchical bit line architecture is illustrated in FIG. 2 and one example of a more detailed diagram including the 2T DRAM cell is illustrated in FIG. 3.

In the hierarchical approach a small number of cells are connected to local bit line true (LBLT) and local bit line complement (LBLC). The LBLT and LBLC are connected to the gate of an n-channel read head (RH) device as shown in FIG. 3. The drains of the RH devices are connected to the global bit line true and complement (GBLT and GBLC). In the pre-charged state, GBLT and GBLC are charged to Vdd by PCN and PC charges LBLT and LBLC to ground.

At the start of a read access the word line (WL) transitions high turning 'ON' n-device 11 and n-device 12. At the same time PCN transitions 'HIGH' turning 'OFF' p-device 5 and p-device 6 and PC transitions 'LOW' turning 'OFF' n-devices 3 and n-device 4. At the start of a read access the write word line (WWL) is 'LOW' and n-device 7 and n-device 8 are 'OFF'. As the WL transitions 'HIGH' devices 11 and 12 will turn 'ON' and the storage capacitors on the 2T DRAM cell nodes 'W' and 'Z' will be connected through the pass transistors 11 and 12 to the local bit lines true and complement (LBLT and LBLC). We assume the 2T DRAM cell has a '1' or Vdd is stored on the capacitor of node 'W' and a '0' is stored on the capacitor of node 'Z'. As a result of charge transferred from the storage capacitor on node 'W' the local bit line true LBLT will charge towards Vdd. LBLC does not transition but is held at ground (Gnd) by the storage capacitor on node 'Z' which is at ground level. The access time (WL 50% to GBL 50%) of the 2T DRAM cell with 256 bits per global bit line is only slightly slower than that of the hierarchical 6T SRAM. However it is important to note that for the 2T DRAM there will be an additional delay in the access path due to the voltage translation circuitry needed in the word line decoder. A higher voltage is needed on the word line WL to drive the thicker oxide low leakage transistors that are needed for the cell access transistors.

As a result of the local bit line LBLT charging 'HIGH', read head (RH) device 1 will turn 'ON' and global bit line GBLC will discharge to ground. Since local bit line complement LBLC is held at ground, read head (RH) device 2 will remain 'OFF' and global bit line true (GBLT) stays at a 'HIGH' level. In fact GBLC transitioning to a 'LOW' causes p-device 10 to turn 'ON' and clamps GBLT to Vdd. With the 2T DRAM cell either the true or complement global bit line will transition indicating valid data. Therefore the timing is built into the transition of the dual rail data.

Figure 4:
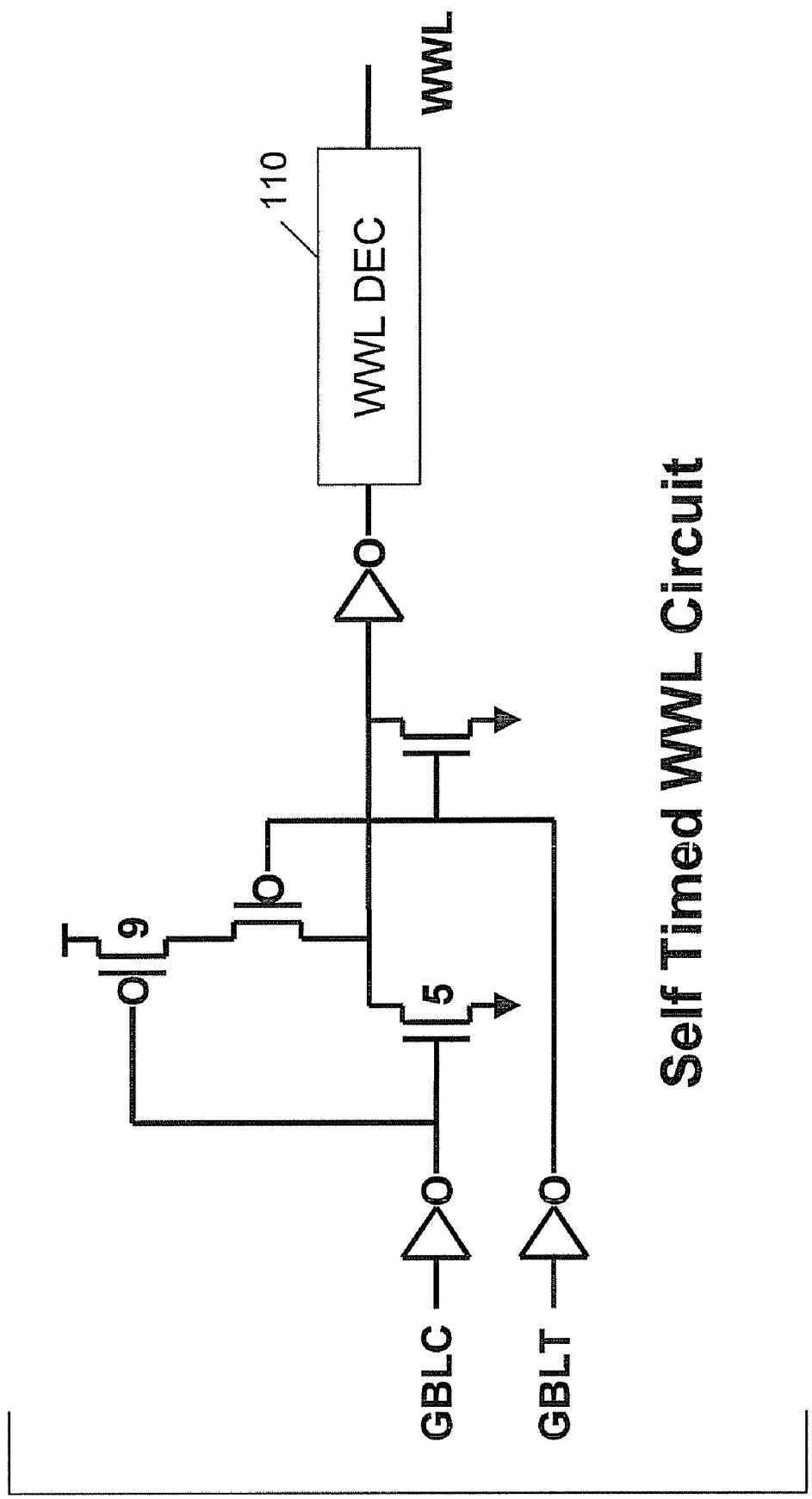
FIG. 4 illustrates one example of a self-timed write word line (WWL) circuit.

Since a read of the 2T DRAM cell is destructive the data that is read must be restored or written back into the cell storage capacitors by turning 'ON' the write word line (WWL). An advantage of the 2T DRAM hierarchical bit line approach is that the restore operation can be made completely self-timed. One example of the self-timed write word line (WWL) circuit is illustrated in FIG. 4. During a read either GBLT or GBLC will transition to a 'LOW' or ground level, which provides an enable signal edge to the previously decoded WWL corresponding to the correct LBL from which the signal was obtained. This is achieved via the WWL DEC 110 illustrated in FIG. 4. In an exemplary embodiment the WWL DEC 110 can be implemented with a standard circuit by one skilled in the art. Therefore the signal for the restore that turns 'ON' the write word line is derived from the data transitioning and is completely self-timed.

In an exemplary embodiment, a write operation for the 2T DRAM cell is almost the same as a read operation. A difference is that at the start of a write access either global bit line true (GBLT) or complement (GBLC) are discharged to ground to write a '0' or '1' in the memory cell. Discharging one of the global bit lines will turn 'ON' the write word line (WWL) so the new data can be written into the 2T DRAM cell.

The HB 2T DRAM cell has roughly 2× the density of the standard 6T SRAM cell with only a slightly slower access. In addition, the 2T DRAM cell does not have the stability issues of the cross-coupled latch 6T SRAMs and the self-timed restore path is much simpler than that of the 1T DRAM. Therefore this approach should be useful in those levels of the hierarchy where both density and speed are needed.

The capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. DRAM memory array comprising:
    a plurality of memory cells, each of said plurality of memory cells further comprising:
        a device, each of said plurality of memory cells having two of said device organized in a row representing a plurality of words and a bit column representing bits of said plurality of words, each said bit column having a true bit line, and a complement bit line, said true bit line and said complement bit line being balanced and connected in a hierarchical bit line structure, said hierarchical bit line structure comprising a local bit line true, a local bit line complement, a global bit line true, a global bit line complement, and a sensing circuit, said sensing circuit connected to said global bit line true and said global bit line complement effectuating detecting of a differential voltage transition on either line during a read access and providing a sensing strobe signal;
    wherein said device is a transistor, nFET, or pFET;
    wherein said true bit line of a plurality of said bit column are connected directly to said local bit line true, and said complement bit line of a plurality of said bit column are directly connected to said local bit line complement.

2. The DRAM memory array in accordance with claim 1, said DRAM memory array further comprising:
    two of said device arranged as a first device and a second device, said local bit line true is connected to gate of said first device, said first device drain is connected to said global bit line complement, and said first device source is connected to ground, said local bit line complement is connected to gate of said second device, said second device drain is connected to said global bit line true, and said second device source is connected to ground.

3. The DRAM memory array in accordance with claim 2, said DRAM memory array further comprising:
    two of said device arranged as a third device and a fourth device, said local bit line true is connected to drain of said third device, said third device source is connected to said global bit line true, and said third device gate is connected to said fourth device gate, said local bit line complement is connected to drain of said fourth device, said fourth device source is connected to said global bit line complement, and said third device gate and said fourth device gate are connected to a timing signal used during the restoring of cell charge.

4. The DRAM memory array in accordance with claim 3, said DRAM memory array further comprising:
    a NOR self-timed circuit, said NOR self-timed circuit having a timing signal output for restoring the charge lost in said plurality of memory cells during a read and for serving as input to said global bit lines true and said global bit line complement.

* * * * *